United States Patent [19]

Nakaizumi

[11] Patent Number: 4,628,218
[45] Date of Patent: Dec. 9, 1986

[54] DRIVING CIRCUIT SUPPRESSING PEAK VALUE OF CHARGING CURRENT FROM POWER SUPPLY TO CAPACITIVE LOAD

[75] Inventor: Kazuo Nakaizumi, Tokyo, Japan

[73] Assignee: Nippon Electric Co., Ltd., Tokyo, Japan

[21] Appl. No.: 463,420

[22] Filed: Feb. 3, 1983

[30] Foreign Application Priority Data

Feb. 3, 1982 [JP] Japan .................................. 57-16122

[51] Int. Cl.[4] ...................... H03K 17/12; H03K 17/04; H03K 19/017; H03K 17/13
[52] U.S. Cl. .................................. 307/451; 307/270; 307/579; 307/585; 307/578; 307/443
[58] Field of Search .................... 307/200 B, 443, 446, 307/450, 451, 452, 473, 475, 572, 577, 579, 581, 583, 585, 591, 592, 594, 595, 597, 603, 605, 270, 297, 453, 482, 578

[56] References Cited

U.S. PATENT DOCUMENTS

| T955,006 | 2/1977 | Cavaliere et al. | 307/585 |
| 4,042,838 | 8/1977 | Street et al. | 307/270 |
| 4,384,216 | 5/1983 | Pricer | 307/450 X |
| 4,424,456 | 1/1984 | Shiraki et al. | 307/451 X |
| 4,477,735 | 10/1984 | Gollinger et al. | 307/450 X |
| 4,488,066 | 12/1984 | Shoji | 307/475 X |
| 4,499,387 | 2/1985 | Konishi | 307/585 X |

FOREIGN PATENT DOCUMENTS

| 93433 | 7/1981 | Japan | 307/450 |

Primary Examiner—Stanley D. Miller
Assistant Examiner—David R. Bertelson
Attorney, Agent, or Firm—Sughrue, Mion, Zinn, Macpeak, and Seas

[57] ABSTRACT

A buffer circuit, which supplies current to a capacitive load, has a first circuit for reducing the power supply charging current to the capacitive load during switching intervals. The first circuit includes a charge storage device precharged between inverter switching intervals to produce at least a portion of the load charging current during the switching intervals. A second circuit includes a switching element connected between the power supply and the capacitive load to electrically connect the power supply through the second circuit to the load at a selected time in the switching interval to supplement the charging current produced by the charge storage device.

11 Claims, 6 Drawing Figures

DRIVING CIRCUIT SUPPRESSING PEAK VALUE OF CHARGING CURRENT FROM POWER SUPPLY TO CAPACITIVE LOAD

BACKGROUND OF THE INVENTION

The present invention relates to an inverter or switching circuit making use of complementary insulated gate field effect transistors (hereinafter abbreviated as CMOSFET's). More particularly, it relates to an inverter circuit with a capacitive load connected to the output terminal thereof in which a heavy transient current flows from a power supply under a transient condition where an input signal is changed to invert the inverter output.

Since an inverter circuit using CMOSFET's (hereinafter abbreviated as CMOS inverter) consumes little power in the steady state condition, its use in large-scale integrated circuits (thereinafter abbreviated as IC) is desirable. Under the transient condition, however, a considerably large power supply current (hereinafter abbreviated as $I_{DD}$) flows through the CMOS inverter due to a charging current flowing to a capacitive component of the load. Accordingly, the peak value of $I_{DD}$ in the CMOS inverter is large during the transient period. Therefore, it is necessary to take measures, such as lowering the impedance of power supply wirings to the CMOS inverter to reduce this transient current. But such a measure would deteriorate a valuable feature of the CMOS circuit; namely, that it can use fine wirings because of the low steady state power consumption. This problem becomes more remarkable in a memory IC where a large number of address inverters operate simultaneously. For instance, in a 64K-bit memory, an address input is 16-bits, which means that at least 16 address inverters operate simultaneously in response to 16 address input signals applied in parallel. In that case, $I_{DD}$ is multiplied by a factor of 16, causing an extremely large peak current to flow from the power supply of this memory IC. Consequently, a noise is generated in the power supply lines, causing many faults in the operation of the memory IC.

It has been proposed to reduce the peak current by prolonging the CMOS inverter switching time to thereby gradually charge the load capacitance. However, this method has a drawback that speed-up of the whole IC is prevented because of the prolonged response time of the inverter.

SUMMARY OF THE INVENTION

It is an object of the present invention to provide an inverter circuit, in which the peak value of the load capacitance charging current component of the power supply current can be largely reduced while maintaining high-speed operation.

According to one feature of the present invention, there is provided an inverter circuit responsive to an input signal for outputting an inverted signal of the input signal, with a first auxiliary circuit connected to the inverter circuit. The first auxiliary circuit includes an auxiliary capacitor which is charged at a time other than the transient time when the output transfers from the low level to the high level (e.g. when the input signal is "1" (or "0") level), and is discharged during the transient period when the input signal is changed from the low level to the high level. Since the discharge current from the auxiliary capacitor is added to the power supply current from the power supply for charging the capacitive load in the transient period, the peak power supply current during the transient period can be greatly reduced. The power supply current for charging the auxiliary capacitor flows at a time other than the transient period and contributes to the reduced peak current.

According to another feature of the invention, a second auxiliary circuit is added to the inverter circuit in parallel with the first auxiliary circuit to feed a part of the output current of the inverter circuit at least after the discharging current from the auxiliary capacitor starts to flow and favorably after the mentioned discharging current ends during the transient period.

The inverter circuit may comprise a first P-channel type field effect transistor (hereinafter abbreviated as Pch-FET) and a first N-channel type field effect transistor (hereinafter abbreviated as Nch-FET) connected in series between the two power supply terminals, the gates of these FET's being commonly connected to an input terminal, and the common junction point therebetween being used as an output terminal. The first auxiliary circuit may include second, third and fourth Pch-FET's (or Nch-FET's) connected in series between one of the power supply terminals and the output terminal of the inverter circuit with their respective gates connected to the other power supply terminal, the output terminal of the inverter circuit and the input terminal of the inverter circuit, respectively. An auxiliary capacitor is inserted between the common junction point between the second and third FET's and the other power supply terminal. The second auxiliary circuit may include a fifth Pch-FET (or Nch-FET) inserted between the one of the power supply terminals and the output terminal of the inverter circuit and a delay circuit coupled between the input terminal of the inverter circuit and the gate of the fifth FET. The second auxiliary circuit may further include a sixth Pch-FET (or Nch-FET) inserted between the drain of the fifth FET and the output terminal of the inverter circuit and having its gate connected to the input terminal of the inverter circuit. With the first and second auxiliary circuits, the inverter circuit according to this invention can reduce the peak value of the capacitive load charging current component of the power supply current as compared to the prior art inverter circuit, while maintaining a high-speed operation.

DETAILED DESCRIPTION OF PREFERRED EMBODIMENTS

Figure 1:
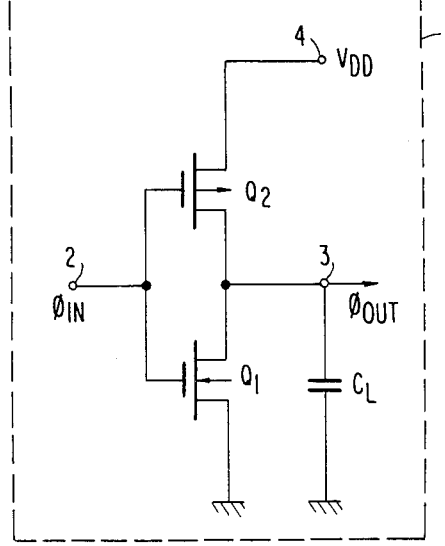
FIG. 1 is a circuit diagram of a basic inverter circuit in the prior art making use of CMOSFET's.

Referring to FIG. 1, a prior art inverter circuit comprises an Nch-FET $Q_1$ and a Pch-FET $Q_2$ with their drains connected in common to form an output terminal 3. The source of the FET $Q_1$ is connected to a $V_{SS}$ power supply terminal (in the illustrated example, to the ground terminal) and the source of the FET $Q_2$ is connected to a $V_{DD}$ power supply terminal 4 (in the illustrated example, $V_{DD}$ represents a positive voltage). The gates of both FET's are connected in common and form an input terminal 2. It is to be noted that a load capacitor $C_L$ is present between the output terminal 3 and the ground terminal.

Figure 2:
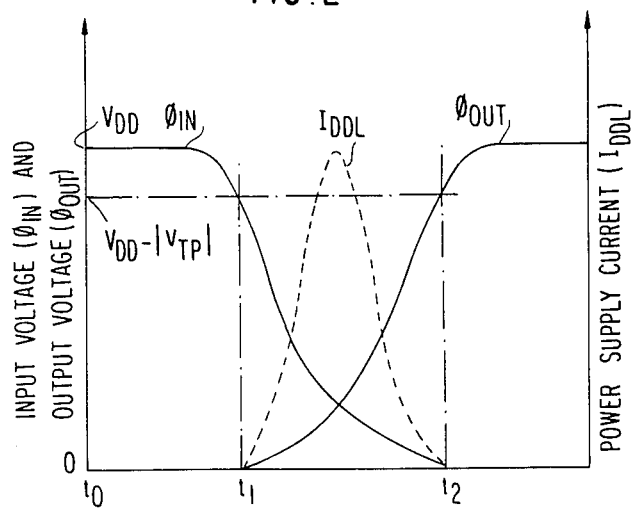
FIG. 2 illustrates the waveforms of an input signal $\phi_{IN}$, an output signal $\phi_{OUT}$, and a charging current component $I_{DDL}$ of the power supply current $I_{DD}$ as functions of time for the inverter circuit shown in FIG. 1.

Referring also to FIG. 2, when the input signal $\phi_{IN}$ is at "1" level (in the illustrated example, a high voltage $V_{DD}$ level) at a time $t_o$, the Nch-FET $Q_1$ is ON, and hence the output signal $\phi_{OUT}$ maintains "0" level ($V_{SS}$ level). Since the Pch-FET $Q_2$ is OFF at this time, the power supply current $I_{DD}$ does not flow. Subsequently, the input signal $\phi_{IN}$ begins to transfer from the "1" level to the "0" level (in the illustrated example the low voltage $V_{SS}$ is the 0 volt level), and when the voltage of the input signal has lowered to $V_{DD} - |V_{TP}|$ ($V_{TP}$: a threshold voltage of the Pch-FET $Q_2$) at a time $t_1$, the Pch-FET $Q_2$ is turned ON and a power supply current $I_{DD}$ begins to flow. As a result, the voltage of the output signal $\phi_{OUT}$ begins to rise, determined by the capability ratio between the Nch-FET $Q_1$ and the Pch-FET $Q_2$. As the voltage of the output signal $\phi_{OUT}$ rises, the load capacitor $C_L$ is driven, and a charging current $I_{DDL}$ flows from the $V_{DD}$ power supply terminal through the Pch-FET $Q_2$ into the load capacitor $C_L$. Therefore, the power supply current $I_{DD}$ which is the sum of the charging current $I_{DDL}$ and a current $I_{DDO}$ flowing through the FET $Q_1$ to the ground becomes large. Then, the input signal $\phi_{IN}$ approaches the "0" level, and when the voltage reaches $V_{TN}$ (a threshold voltage of the Nch-FET $Q_1$), the Nch-FET $Q_1$ is turned OFF, and the power supply current component flowing through the Nch-FET $Q_1$ ($I_{DDO}$) stops. When the input signal $\phi_{IN}$ reaches "0" level at a time $t_2$, the output signal $\phi_{OUT}$ also reaches "1" level, so that the $I_{DDL}$ also stops flowing. Thus the charging current component $I_{DDL}$ has a nearly symmetric waveform with a large peak value. The peak value of the charging current $I_{DDL}$ become larger as the load capacitor $C_L$ is increased. As described previously, an important problem to be solved is how best to reduce the peak value of this $I_{DDL}$.

Figure 3:
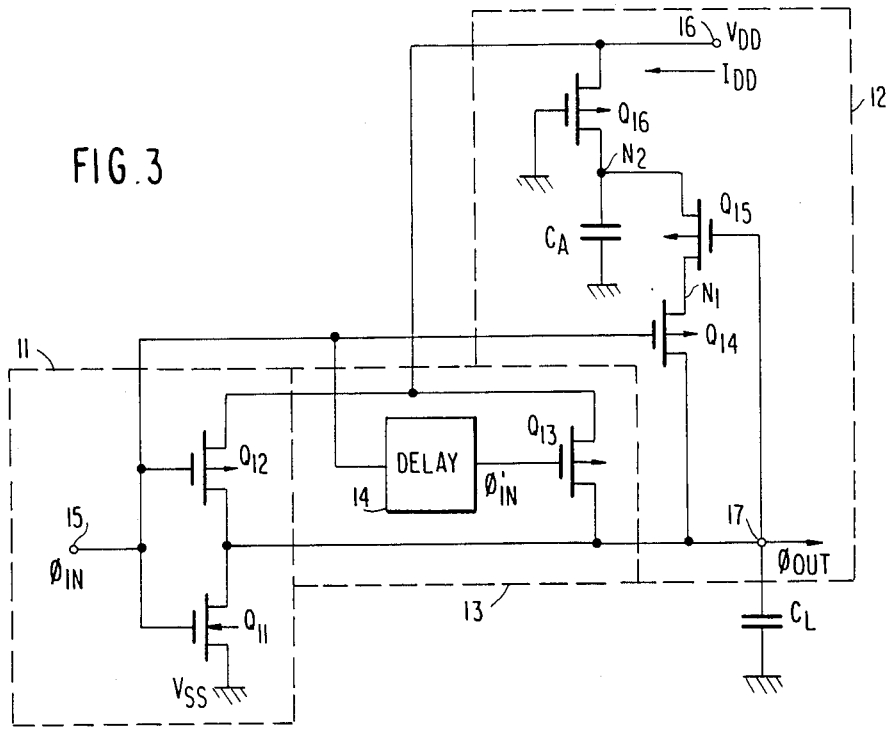
FIG. 3 is a circuit diagram showing one preferred embodiment of the present invention.

With reference to FIG. 3, the circuit of a preferred embodiment of the present invention comprises a basic inverter circuit 11 which includes a first Pch-FET $Q_{12}$ and a first Nch-FET $Q_{11}$ connected in series at an output terminal 17. The source of the Nch-FET $Q_{11}$ is connected to $V_{SS}$ terminal (the ground terminal in this example) and the source of the Pch-FET $Q_{12}$ is connected to a $V_{DD}$ power supply terminal 16. The gates of the Nch-FET $Q_{11}$ and the Pch-FET $Q_{12}$ are both connected to an input terminal 15. A first auxiliary circuit 12 is added to the inverter circuit 11, which in turn includes second, third and fourth Pch-FET's $Q_{14}$, $Q_{15}$ and $Q_{16}$ connected in series between the $V_{DD}$ power supply terminal 16 and the output terminal 17. The respective gates of $Q_{14}$, $Q_{15}$ and $Q_{16}$ are connected to the input terminal 15, the output terminal 17, and the ground terminal, respectively. The first auxiliary circuit further includes an auxiliary capacitor $C_A$ inserted between the common junction point N2 of the Pch-FET's $Q_{15}$ and $Q_{16}$ and the ground terminal. A second auxiliary circuit 13 is also added, which includes a fifth Pch-FET $Q_{13}$ inserted between the $V_{DD}$ power supply terminal 16 and the output terminal 17 and a delay circuit 14 inserted between the input terminal 15 and the gate of $Q_{13}$. The delay circuit 14 is used to delay the input signal $\phi_{IN}$ by a predetermined period. Since precision is not required, the delay circuit 14 can be easily constructed using known techniques.

Figure 4:
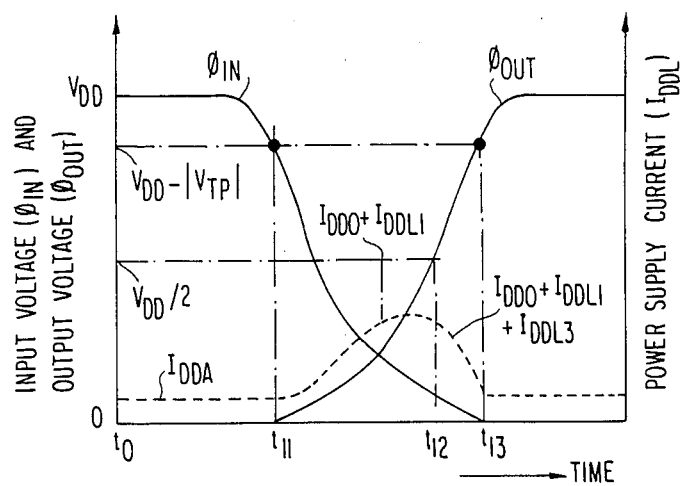
FIG. 4 illustrates the waveforms of the input voltage $\phi_{IN}$ the output voltage $\phi_{OUT}$ and the charging current component $I_{DDL}$ of the power supply current as functions of time as the inverter circuit of FIG. 3 goes from the "1" level to "0" level.

Now description will be made of the operation of this circuit when the input signal $\phi_{IN}$ transfers from "1" level ($V_{DD}$) to the "0" level (ground), with reference to FIG. 4. Since the basic inverter circuit 11 has the same construction as the circuit in the prior art shown in FIG. 1, its operation is basically the same as that of the prior art circuit.

At first, when the input signal $\phi_{IN}$ is at the "1" level ($V_{DD}$) at a time between $t_o$ and $t_{11}$, the Pch-FET's $Q_{15}$ and $Q_{16}$ of the first auxiliary circuit 12 are ON and the Pch-FET $Q_{14}$ is OFF. Hence the auxiliary capacitor $C_A$ is charged via the Pch-FET $Q_{16}$ by $V_{DD}$ and stores electric charge therein. Accordingly, the charging current $I_{DDA}$ for this capacitor $C_A$ flows from the $V_{DD}$ power supply terminal 16 as a component of the power supply current $I_{DD}$, during the period of time $t_o$ to $t_{11}$. At this moment, the Nch-FET $Q_{11}$ is ON and the Pch-FET's $Q_{12}$ and $Q_{13}$ are OFF. Therefore, the output voltage $\phi_{OUT}$ at the output terminal 17 is at the "0" level, and the power supply current $I_{DDO}$ through the Nch-FET $Q_{11}$ and the charging current $I_{DDL}$ for the load capacitor $C_L$ are both zero.

Within the period of $t_0$ to $t_{11}$, the input signal $\phi_{IN}$ starts to fall. When the voltage of the input signal $\phi_{IN}$ is lowered to $V_{DD} - |V_{TP}|$ at the time $t_{11}$, the Pch-FET $Q_{12}$ and the Pch-FET $Q_{14}$ are turned ON, and hence a current $I_{DDO}$ through the Pch-FET $Q_{12}$ and the Nch-FET $Q_{11}$ and a charging current $I_{DDL1}$ through the Pch-FET $Q_{12}$ and load capacitor $C_L$ for charging the load capacitor $C_L$ begin to flow. Furthermore, the electric charge previously stored in the auxiliary capacitor $C_A$ begins to discharge as a part of the charging current for the load capacitor $C_L$ through the Pch-FET $Q_{14}$ (this component being represented by $I_{DDL2}$). Since this discharge current $I_{DDL2}$ is based on the discharge of electric charge that has been preliminarily stored in the auxiliary element $C_A$, an increment of the power supply current $I_{DD}$ that is necessary for $I_{DDL2}$ after the time $t_{11}$ is very small. If the conductance of the Pch-FET $Q_{16}$ is chosen less than about 1/10 of that of the Pch-FET $Q_{12}$, then the $I_{DD}$ component passing through the Pch-FET $Q_{16}$ is very small, and therefore it can be neglected. Moreover, if the auxiliary capacitor $C_A$ is chosen nearly the same size as the load capacitor $C_L$, then about one-half of the charging current $I_{DDL}$ can be obtained from $I_{DDL2}$.

Subsequently, the voltage of the input signal $\phi_{IN}$ is further lowered after $t_{11}$ and accordingly the voltage of the output signal $\phi_{OUT}$ rises, and when the output voltage value reaches about $V_{DD}/2$ at a time $t_{12}$, the input signal $\phi'_{IN}$ delayed by the delay circuit 14 in the second auxiliary circuit is applied to the Pch-FET $Q_{13}$, so that the Pch-FET $Q_{13}$ is turned ON and sends out an output current to the output terminal 17 which forms another part of the charging current for the load capacitor $C_L$ (this component being called $I_{DDL3}$). As a result the power supply current $I_{DD}$ now includes the $I_{DDL3}$ component. On the other hand, the potential at the node $N_2$ which serves as one terminal of the auxiliary capacitor $C_A$ becomes nearly the same level as the $\phi_{OUT}$ when the voltage of the output signal $\phi_{out}$ exceeds $V_{DD}/2$, and hence the Pch-FET $Q_{15}$ is turned OFF, so that the charging current $I_{DDL2}$ from the auxiliary capacitor $C_A$ is eliminated. Therefore, at this time the charging current for the load capacitor $C_L$ is comprised of two components; that is, the $I_{DDL1}$ passing through the Pch-FET $Q_{12}$ and the $I_{DDL3}$ passing through the Pch-FET $Q_{13}$. This $I_{DDL3}$ component compensates for the loss of the above-described $I_{DDL2}$ component to promote charging of the load capacitor $C_L$ and serves to quickly raise the voltage of the output signal $\phi_{OUT}$. Therefore, it is favorable to select the conductance of the Pch-FET $Q_{13}$ larger than that of the Pch-FET $Q_{12}$.

Next, when the input signal $\phi_{IN}$ approaches the "0" level and its voltage becomes equal to or lower than $V_{TN}$, then the Nch-FET $Q_{11}$ is turned OFF, and hence the $I_{DDO}$ component passing through the Nch-FET stops. Then, the input signal $\phi_{IN}$ reaches the "0" level and the output signal $\phi_{OUT}$ reaches the "1" level at a time $t_{13}$, and as a result, the $I_{DDL1}$ component passing through the Pch-FET $Q_{12}$ as well as the $I_{DDL3}$ component passing through the Pch-FET $Q_{13}$ are also eliminated.

As will be apparent from the above description, in the circuit of the illustrated embodiment, the charging current $I_{DDL}$ for the load capacitor $C_L$ is formed in such a manner that until the voltage of the output signal $\phi_{OUT}$ becomes nearly equal to $V_{DD}/2$, the charging current is comprised of the $I_{DDL1}$ passing through the Pch-FET $Q_{12}$ and the discharging current $I_{DDL2}$ of the auxiliary capacitor $C_A$ which has been preliminarily charged, and after the output signal $\phi_{OUT}$ nearly exceeds $V_{DD}/2$, the $I_{DDL2}$ is eliminated and instead the $I_{DD3}$ passing through the Pch-FET $Q_{13}$ is newly added. Consequently, the load capacitor charging current component $I_{DDL}$ of the power supply current of the circuit would flow over the entire region of operation, and its peak value during the period $t_{11}$ to $t_{13}$ becomes very small as shown in FIG. 4. The extent of this reduction of the peak value depends upon the design of the first and second auxiliary circuits such as the magnitude of the auxiliary capacitor $C_A$ and the conductance of the Pch-FET $Q_{13}$. However, it is quite easy to reduce the peak value of the charging current to $\frac{1}{2}$ or less of the peak value in the prior art inverter circuit.

Furthermore, since those auxiliary charging currents can be subjected to appropriate adjustment by varying the delay characteristics of the delay circuit 14 in the second auxiliary circuit 13 so as to meet the response time of the circuit, there is no need to prolong a response time of the inverter circuit 11, and the response time may be rather shortened by selecting appropriate timing.

Now description will be made of the case where the input signal transfers from the "0" level to the "1" level, with reference to FIG. 5 which shows waveforms of the input signal $\phi_{IN}$, the output signal $\phi_{OUT}$ and the power supply current $I_{DD}$ for this case.

At first, during the period $t_0$ to $t_{20}$, when the input signal $\phi_{IN}$ is at the "0" level (ground), the Pch-FET's $Q_{12}$, $Q_{13}$, $Q_{14}$ and $Q_{16}$ are ON and the Nch-FET $Q_{11}$ and the Pch-FET $Q_{15}$ are OFF. Accordingly, the auxiliary capacitor $C_A$ is charged, and a power supply charging current $I_{DDA}$ flows.

Next, the input signal $\phi_{IN}$ starts to rise at a time $t_{20}$. When it rises up to $V_{TN}$ at a time $t_{21}$, the Nch-FET $Q_{11}$ is turned ON and the discharging current of the load capacitor $C_L$ begins to flow through the Nch-FET $Q_{11}$. Furthermore the power supply current $I_{DDO}$ flows through the Pch-FET $Q_{12}$ and the Nch-FET $Q_{11}$, and the power supply current $I_{DDO}'$ flows through the Pch-FET $Q_{13}$ and the Nch-FET $Q_{11}$. At this moment, since the Pch-FET $Q_{15}$ is kept OFF, only the $I_{DDA}$ flows through the first auxiliary circuit.

Figure 5:
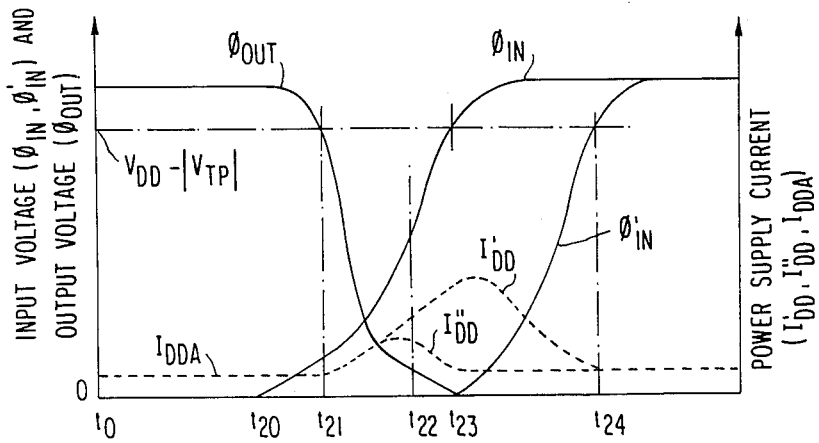
FIG. 5 illustrates the waveforms of the input voltage $\phi_{IN}$, the output voltage $\phi_{OUT}$ and the charging current components of the power supply current as functions of time as the inverter circuits of FIGS. 3 and 6 are changed from "0" level to "1" level.

Subsequently, when the input signal $\phi_{IN}$ reaches $V_{DD}-|V_{TP}|$, at a time $t_{23}$, the Pch-FET $Q_{13}$ is turned OFF and the $I_{DDO}$ stops flowing, but since the voltage of the delayed signal $\phi_{IN}'$ for the input signal $\phi_{IN}$ which is a driving voltage for the Pch-FET $Q_{13}$ does not rise as shown in FIG. 5, the Pch-FET $Q_{13}$ is still kept ON, and so the $I_{DDO}'$ continues to flow. Thereafter when the $\phi_{IN}'$ becomes $V_{DD}-V_{TP}$ at a time $t_{24}$, the Pch-FET $Q_{13}$ is turned OFF and the $I_{DDO}'$ stops flowing. The input signal $\phi_{IN}$ reaches the "1" level, and the output signal $\phi_{OUT}$ reaches the "0" level.

In other words, in the transient period when the input signal $\phi_{IN}$ transfers from the "0" level to the "1" level, the $I_{DDO}'$ passing through the Pch-FET $Q_{13}$ is added to the power supply current $I_{DDO}$ which flows together with the discharge current of the load capacitor $C_L$ in the circuit known in the prior art, and therefore, the overall power supply current $I'_{DD}$ takes the form shown in FIG. 5. As described, the circuit of the illustrated embodiment of FIG. 3 has a problem that although the peak value of the load capacitor charging current component $I_{DDL}$ of the power supply current $I_{DD}$ can be greatly reduced when the input signal $\phi_{IN}$ transfers from the "1" level to the "0" level, the power supply current $I_{DDO}'$ caused by the second auxiliary circuit is added to the power supply current when the input signal $\phi_{IN}$ transfers from the "0" level to the "1" level.

Figure 6:
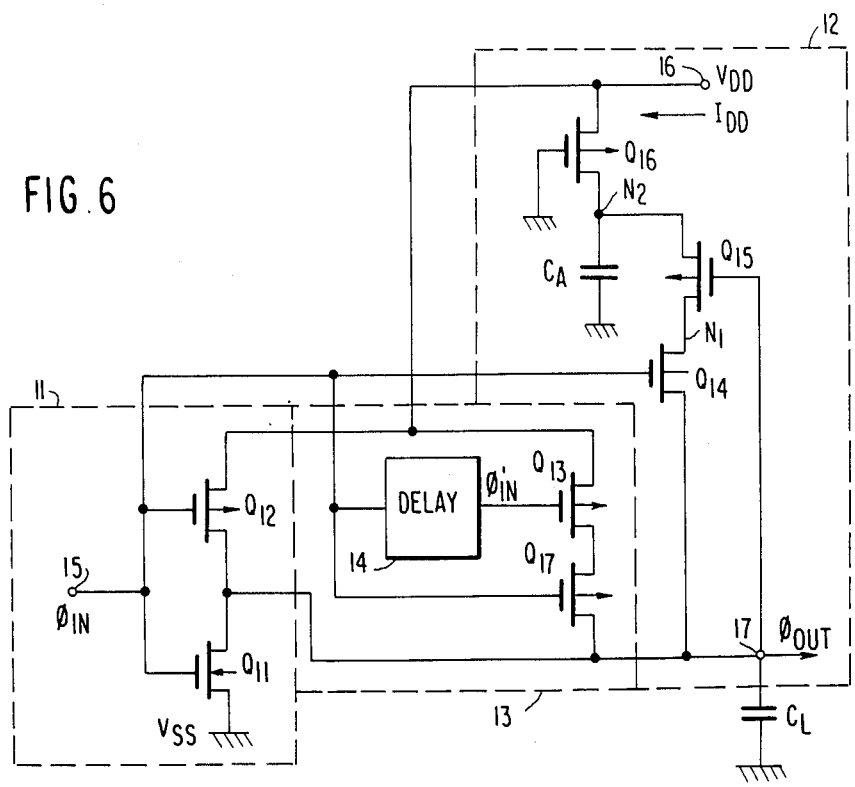
FIG. 6 is a circuit diagram showing another preferred embodiment of the present invention.

The circuit of another preferred embodiment of the present invention shown in FIG. 6 solves the above-mentioned problem. The only difference from the circuit shown in FIG. 3 and described previously resides in that the second auxiliary circuit 13' includes another Pch-FET $Q_{17}$ inserted between the drain of the Pch-FET $Q_{13}$ and the output terminal 17 and having its gate connected to the input terminal 15. In this circuit of the modified embodiment, the Pch-FET $Q_{17}$ is turned OFF in response to the input signal $\phi_{IN}$ and the $I_{DDO}'$ also ceases to flow at the same time when $I_{DDO}$ ceases to flow through $Q_{12}$. Therefore, the $I_{DD}$ in this modified embodiment becomes small as indicated by $I''_{DD}$ in FIG. 5.

It is to be noted that in the above-described embodiments, the conductivity type of the respective FET's can be changed if necessary. For instance, in place of the Pch-FET an Nch-FET can be used for the FET $Q_{14}$, and an inverted input signal $\overline{\phi_{IN}}$ would then be applied to the gate of this FET. The Pch-FET's and Nch-FET's may be replaced by Nch-FET's and Pch-FET's, respectively, with the terminals of the power supply voltage being reversely connected.

What is claimed is:

1. An inverter circuit comprising a first field effect transistor of one conductivity type, a second field effect transistor of the opposite conductivity type connected with said first transistor in series between two terminals of a power supply, an input terminal coupled to the gates of said first and second transistors, an output terminal coupled to the connection point of said first and second transistors, a capacitive load coupled to said output terminal, a capacitor, first means coupled to said capacitor and to one of said two terminals of the power supply for charging said capacitor at a time other than a transient time when a potential at said output terminal transfers from a first level to a second level, and a second means coupled to said capacitor and said capacitive load for charging said capacitive load with a discharging current from said capacitor during said transient time.

2. The inverter of claim 1, further comprising a third means coupled to said one terminal of the power supply and said capacitive load for charging said capacitive load with a current from said power supply during said transient time after the discharging current from said capacitor starts to flow.

3. An inverter as claimed in claim 1, in which said first means includes a first switch transistor connected between said one terminal of the power supply and said capacitor and said second means includes a second and a third switch transistors connected in series between a connection point of said first switch transistor and said capacitor and said capacitive load, said second switch transistor being controlled by the voltage at said output terminal, and said third switch transistor being controlled by an input signal at said input terminal.

4. An inverter as claimed in claim 2, in which said third means includes a delay circuit for delaying an input signal at said input terminal and a fourth switch transistor connected between said one terminal of the power supply and said output terminal.

5. An inverter comprising an inverter circuit responsive to an input signal for producing an output signal that is inverted relative to the input signal, a first auxiliary circuit and a second auxiliary circuit connected in parallel between an output terminal of said inverter circuit and a power supply, respectively, said first auxiliary circuit including an auxiliary capacitor and including means to discharge electric charge stored in said auxiliary capacitor during a transient period where the output of the inverter goes from a "0" level to a "1" level, said second auxiliary circuit including means for applying a current to the output terminal of said inverter circuit in a predetermined period during said transient period.

6. An inverter as claimed in claim 5, in which said inverter circuit includes a first P-channel type field effect transistor and a first N-channel type field effect transistor connected in series and inserted between the power supply and a circuit ground terminal, the gates of said two transistors being connected in common to form an input terminal, a common junction point between said two transistors being coupled to an output terminal, said first auxiliary circuit including second, third and fourth P-channel type field effect transistors connected in series with each other and having their gates connected to the ground terminal, said output terminal and said input terminal, respectively, and an auxiliary capacitor inserted between the common junction point of said second and third P-channel type field effect transistor and the ground terminal, said second auxiliary circuit including a delay circuit and a fifth P-channel type field effect transistor having its gate connected through the delay circuit to said input terminal.

7. An inverter as claimed in claim 6, in which said second auxiliary circuit includes a sixth P-channel type field effect transistor inserted between said fifth P-channel type field effect transistor and said output terminal and having its gate connected to said input terminal.

8. In an inverter circuit for applying an output signal to a load, first means responsive to an input signal for applying a first charging current to said load during selected switching intervals of said inverter circuit, a charge storage device, and second means responsive to said input signal for charging said charge storage device between said switching intervals of said inverter circuit and for causing said charge storage device to discharge into said load during said selected inverter circuit switching intervals.

9. In the inverter circuit of claim 8, further including a third means for applying a second charging current to said load during selected periods within inverter switching intervals, said third means including a delay circuit responsive to said input signal and a switching means responsive to said delay circuit for applying said second charging current a predetermined time after the input signal begins to switch from a first level causing said output signal to assume a relatively low voltage state to a second level causing said output signal to assume a relatively high voltage state.

10. A circuit for driving a capacitive load, comprising first means responsive to an input signal for charging and discharging said capacitive load, a capacitor, second means coupled between said capacitor and a power supply terminal for charging said capacitor before said first means charges said capacitive load, and third means coupled between said capacitor and said capacitive load for charging said capacitive load by a discharge current from said capacitor when said first means charges said capacitive load.

11. The circuit as claimed in claim 10, further comprising fourth means coupled between said power supply terminal and said capacitive load for charging said capacitive load after said discharge current from said capacitor starts to flow.

* * * * *

UNITED STATES PATENT AND TRADEMARK OFFICE
CERTIFICATE OF CORRECTION

PATENT NO. : 4,628,218
DATED : December 9, 1986
INVENTOR(S) : Kazuo NAKAIZUMI

It is certified that error appears in the above-identified patent and that said Letters Patent is hereby corrected as shown below:

Column 6, Line 14, delete "$\emptyset_{IN}$" (first occurrence), and insert therefor --$\emptyset'_{IN}$--.

Signed and Sealed this

Twenty-first Day of April, 1987

*Attest:*

DONALD J. QUIGG

*Attesting Officer*     *Commissioner of Patents and Trademarks*